(12) United States Patent
Chen et al.

(10) Patent No.: US 11,646,509 B2
(45) Date of Patent: May 9, 2023

(54) GROUNDING ELASTIC CONTACT AND ELECTRONIC DEVICE

(71) Applicant: Shenzhen Johan Material Technology Co., Ltd., Guangdong (CN)

(72) Inventors: Mujiu Chen, Guangdong (CN); Fang Chen, Guangdong (CN); Qiao Chen, Guangdong (CN); Jingyun Liu, Guangdong (CN)

(73) Assignee: Shenzhen Johan Material Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/858,227

(22) Filed: Jul. 6, 2022

(65) Prior Publication Data

US 2023/0093996 A1 Mar. 30, 2023

(30) Foreign Application Priority Data

Sep. 30, 2021 (CN) .......................... 202111169094.1

(51) Int. Cl.
*H05K 9/00* (2006.01)
*H01R 13/6584* (2011.01)
(Continued)

(52) U.S. Cl.
CPC .............. *H01R 4/625* (2013.01); *B32B 27/36* (2013.01); *H01R 13/6584* (2013.01); *H05K 9/0009* (2013.01); *H05K 9/0015* (2013.01)

(58) Field of Classification Search
CPC .... H05K 9/0009; H05K 9/0015; H05K 9/002; H01R 13/6584; H01R 13/24;
(Continued)

(56) References Cited

U.S. PATENT DOCUMENTS

| | | | | |
|---|---|---|---|---|
| 4,857,668 A | * | 8/1989 | Buonanno ............ | H05K 9/0015 174/356 |
| 5,045,635 A | * | 9/1991 | Kaplo ...................... | H02B 1/16 219/738 |
| 6,410,137 B1 | * | 6/2002 | Bunyan ................ | H05K 9/0084 428/407 |

(Continued)

FOREIGN PATENT DOCUMENTS

| | | |
|---|---|---|
| CN | 112351666 A | 2/2021 |
| CN | 112993606 A | 6/2021 |

(Continued)

*Primary Examiner* — Hoa C Nguyen
*Assistant Examiner* — Amol H Patel (57) ABSTRACT

A grounding elastic contact and an electronic device including the same. The grounding elastic contact includes an elastic core, and a double-sided polyethylene terephthalate (PET) tape, a polyimide (PI) film, and a conductive layer, where the PI film is laminated and bonded on an outer side of the double-sided PET tape; a middle region of the double-sided PET tape is attached to an upper surface of the elastic core; after passing through left and right sides of the elastic core respectively, two ends of the double-sided PET tape are laminated on a lower surface of the elastic core; the conductive layer includes one end bonded on the upper surface of the elastic core, and the other end passing through the left side of the elastic core; the double-sided PET tape includes a PET backing and an adhesive coated on two sides of the PET backing.

20 Claims, 8 Drawing Sheets

(51) Int. Cl.
 *H01R 4/62* (2006.01)
 *B32B 27/36* (2006.01)

(58) Field of Classification Search
 CPC .................. H01R 13/2407; H01R 13/2414;
  H01R 4/625; H01R 4/62; H01R 4/58;
  H01R 43/007
 See application file for complete search history.

(56) References Cited

U.S. PATENT DOCUMENTS

| | | | | |
|---|---|---|---|---|
| 7,402,761 B2 * | 7/2008 | Kim | ................. | H05K 9/0015 |
| | | | | 174/358 |
| 7,470,866 B2 * | 12/2008 | Dietrich | ............ | H05K 9/0015 |
| | | | | 174/356 |
| 7,732,714 B2 * | 6/2010 | Hammaker | ............ | F16J 15/121 |
| | | | | 277/924 |
| 7,771,213 B2 * | 8/2010 | Kim | ................. | H05K 3/4015 |
| | | | | 439/83 |
| 8,964,408 B2 * | 2/2015 | Lee | ................. | H05K 9/002 |
| | | | | 720/650 |
| 2002/0108767 A1 * | 8/2002 | Kim | ................. | H05K 9/0015 |
| | | | | 174/360 |
| 2011/0266031 A1 * | 11/2011 | Kim | ................. | H01R 13/2414 |
| | | | | 174/126.2 |
| 2017/0229795 A1 | 8/2017 | Kim | | |
| 2019/0296458 A1 * | 9/2019 | Liu | ................. | H01R 4/48 |

FOREIGN PATENT DOCUMENTS

| | | |
|---|---|---|
| CN | 213694672 U | 7/2021 |
| JP | 2003175563 A | 6/2003 |

* cited by examiner

GROUNDING ELASTIC CONTACT AND ELECTRONIC DEVICE

CROSS REFERENCE TO RELATED APPLICATIONS

The present application claims the benefit of Chinese Patent Application No. 202111169094.1 filed on Sep. 30, 2021, the contents of which are incorporated herein by reference in their entirety.

TECHNICAL FIELD

The present application relates to the technical field of communication devices, and in particular to a grounding elastic contact and an electronic device including the grounding elastic contact.

BACKGROUND

In order to prevent signal interference or eliminate static electricity for communication devices, two surfaces to be grounded are often electrically connected by grounding elastic contacts or welding elastic gaskets. The electrical connection should be as stable as possible. Batch-to-batch consistency is also important, particularly in grounding areas of radio frequency (RF) antennas.

For consumer communication devices such as fifth-generation (5G) mobile phones, due to a high screen-refresh rate and a large number of antennas that are close to a screen edge, good grounding is crucial between the screen and a metal middle frame, so as to eliminate or weaken radiated spurious emission (RSE). Particularly for flexible organic light emitting diode (OLED) screens, due to a small grounding space (usually less than 0.4 mm) and a small stress (usually less than 2 N), higher requirements are imposed on the solution of grounding, and conventional welding metal elastic gaskets are far from satisfactory. In view of the small grounding space, sizes of the grounding elastic contacts are restricted. It is difficult to ensure resilience, reliability of conductivity, in-use stability, and connection stability, and to control manufacturing costs.

SUMMARY

An objective of the present application is to provide a grounding elastic contact, which can achieve higher resilience, ensure reliability of conductivity, connection stability, in-use stability, convenience in production, and lower production cost, and facilitate the manufacture of small-sized products. Another objective of the present application is to provide an electronic device including the grounding elastic contact.

The objectives of the present application are achieved by the following technical solutions.

A grounding elastic contact includes an elastic core, a double-sided polyethylene terephthalate (PET) tape, a polyimide (PI) film, and a conductive layer, where the double-sided PET tape, the PI film, and the conductive layer are sequentially provided on an outer surface of the elastic core from inside to outside; the PI film is laminated and bonded on an outer side of the double-sided PET tape; a middle region of the double-sided PET tape is attached to an upper surface of the elastic core; after passing through left and right sides of the elastic core respectively, two ends of the double-sided PET tape are laminated on a lower surface of the elastic core; and the conductive layer includes one end bonded on the upper surface of the elastic core, and the other end passing through the left side of the elastic core, attached to the lower surface of the elastic core and protruding rightward relative to the elastic core to form a welding part; and the double-sided PET tape includes a PET backing and an adhesive coated on two sides of the PET backing; and a thickness of the double-sided PET tape is b, b≤0.015 mm.

In some embodiments of the present application, 0.008 mm≤b≤0.012 mm.

In some embodiments of the present application, the left side of the elastic core may be attached to the double-sided PET tape, and a gap may be provided between the right side of the elastic core and the double-sided PET tape.

In some embodiments of the present application, an overall length of the grounding elastic contact may be L1, and a length of the welding part may be L2, $$\frac{1}{3}L1 \le L2 \le \frac{1}{2}L1.$$

L1≤8 mm, L2≥2 mm, and

In some embodiments of the present application, L2≤3 mm

In some embodiments of the present application, a height of the grounding elastic contact may be h and a width of which may be w in a natural state, where
0.5≤h≤1.5 mm, w≥2 mm, and $$0.2 \le \frac{h}{w} \le 0.75.$$

In some embodiments of the present application, a thickness of the PI film may be in a range of 7-25 μm.

In some embodiments of the present application, the conductive layer may be a metal foil with a first plated layer on an outer surface thereof, and the first plated layer may include at least one of gold, tin, and nickel.

In some embodiments of the present application, the conductive layer may be a copper foil provided with a gold-plated layer on an outer surface thereof.

In some embodiments of the present application, the elastic core may include polyurethane (PU) foam or silicone foam.

In some embodiments of the present application, the grounding elastic contact may further include:
a metal reinforcing plate provided on an upper surface of the welding part.

In some embodiments of the present application, an anti-oxidative layer may be provided on an upper surface of the metal reinforcing plate.

In some embodiments of the present application, the metal reinforcing plate may be a copper foil provided with an anti-oxidative layer on an upper surface thereof, and the anti-oxidative layer may be a PU layer or a nickel-plated layer.

In some embodiments of the present application, a sum of a thickness of the conductive layer and a thickness of the metal reinforcing plate may be greater than or equal to 20 μm.

In some embodiments of the present application, an insulating non-backing double-sided tape may be provided on a lower surface of the conductive layer which may wrap the lower surface of the elastic core.

An electronic device includes a display screen, a metal middle frame, and any one of the above grounding elastic contacts, where the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

In some embodiments of the present application, the display screen may be a flexible OLED screen or a liquid crystal display (LCD) screen.

In the grounding elastic contact and the electronic device provided by the present application, the overall grounding elastic contact is a P-type structure with the conductive layer opening rightward. A laminated structure formed by the double-sided PET tape and the PI film is bent from the left and right sides respectively to the lower surface of the elastic core for an integrated and complete wrap around the elastic core. With the double-sided PET tape and the PI film for the complete wrap around the elastic core, flatness and fatigue resistance of the conductive layer can be ensured, a damage to the elastic core is prevented, service life of the product is longer, production cost is lower, and product consistency is ensured. With the ultra-thin double-sided PET tape, a thickness loss of the elastic core can be prevented to the greatest extent, and stable low-stress resilience is kept within the limited grounding space. Furthermore, the double-sided PET tape and the PI film at the right side are bent to the lower surface of the elastic core, which can prevent an extension of the tail welding part, reduce a usage of the elastic core, and ensure resilience and welding stability.

BRIEF DESCRIPTION OF THE DRAWINGS

The present application will be further described in detail below with reference to the drawings and preferred embodiments. However, those skilled in the art should understand that these drawings are drawn only for the purpose of explaining the preferred embodiments, and therefore should not be construed as a limitation to the scope of the present application. In addition, unless otherwise specified, the drawings are only intended to conceptually represent the composition or configuration of the described objects and may include exaggerated displays, and the drawings are not necessarily drawn to scale.

Figure 1:
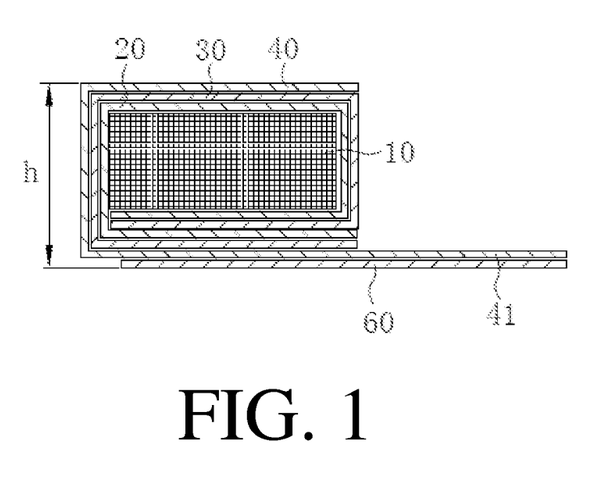
FIG. 1 is a schematic structural view of a grounding elastic contact according to Example 1 of the present application.
Figure 2:
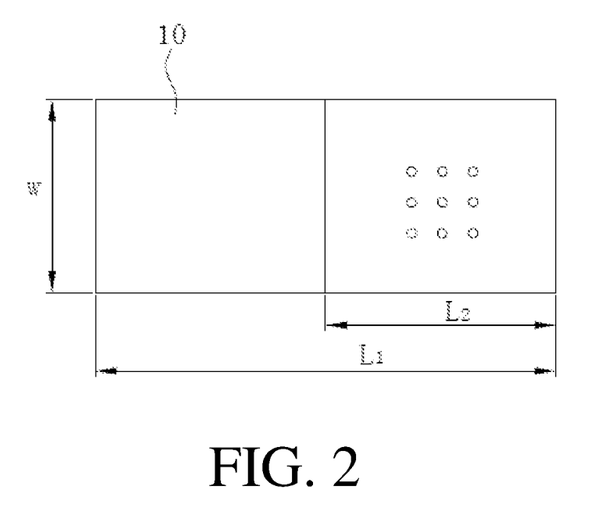
FIG. 2 is a top view of FIG. 1.
Figure 3:
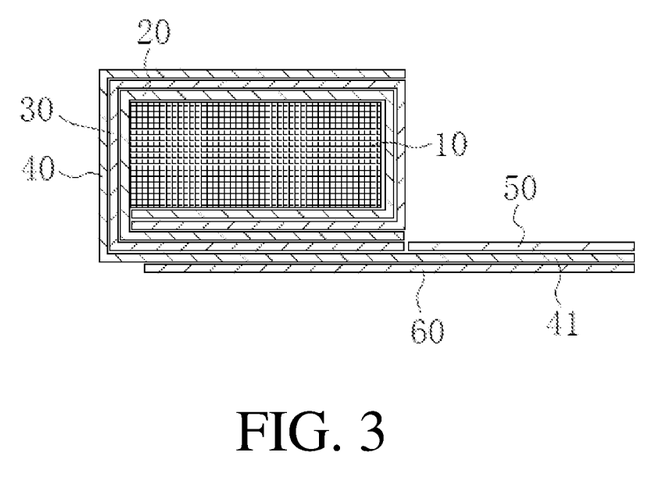
FIG. 3 is a schematic structural view of a grounding elastic contact according to Examples 2, 3, and 4 of the present application.

In FIGS. 1-3: 10: elastic core, 20: double-sided PET tape, 30: PI film, 40: conductive layer, 41: welding part, 50: metal reinforcing plate, and 60: insulating non-backing double-sided tape.

Figure 4:
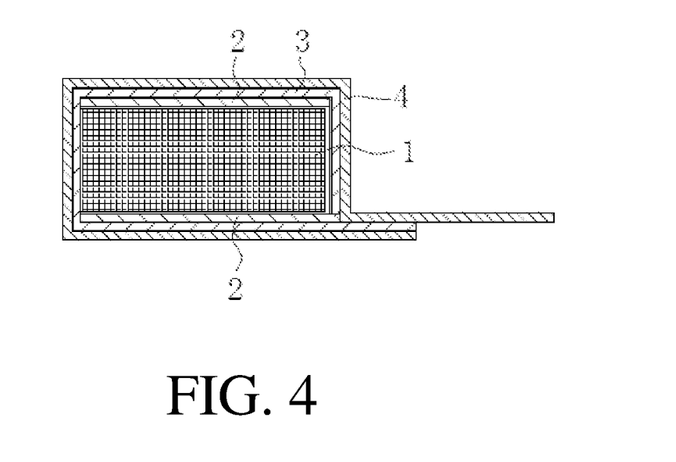
FIG. 4 is a schematic structural view of a grounding elastic contact according to Comparative Example 1.
Figure 5:
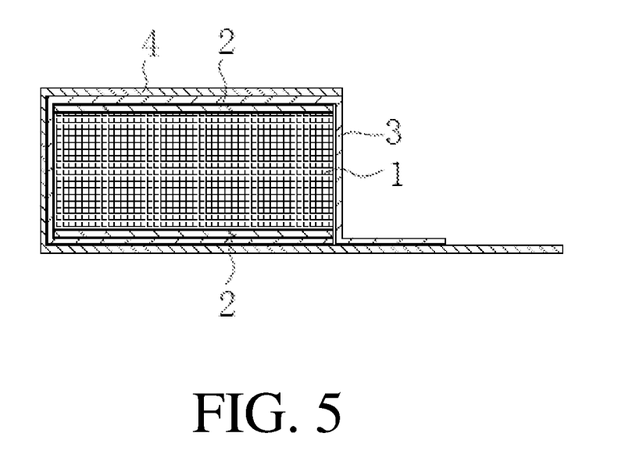
FIG. 5 is a schematic structural view of a grounding elastic contact according to Comparative Example 2.
Figure 6:
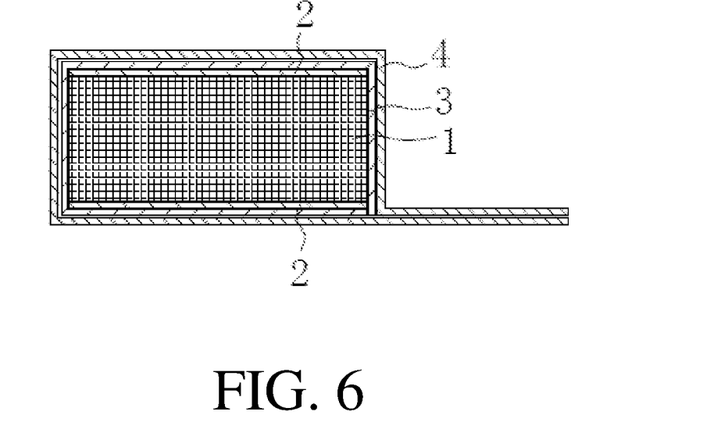
FIG. 6 is a schematic structural view of a grounding elastic contact according to Comparative Example 3.

In FIGS. 4-6: 1: elastic core, 2: PET sheet, 3: PI film, and 4: conductive layer.

Figure 7:
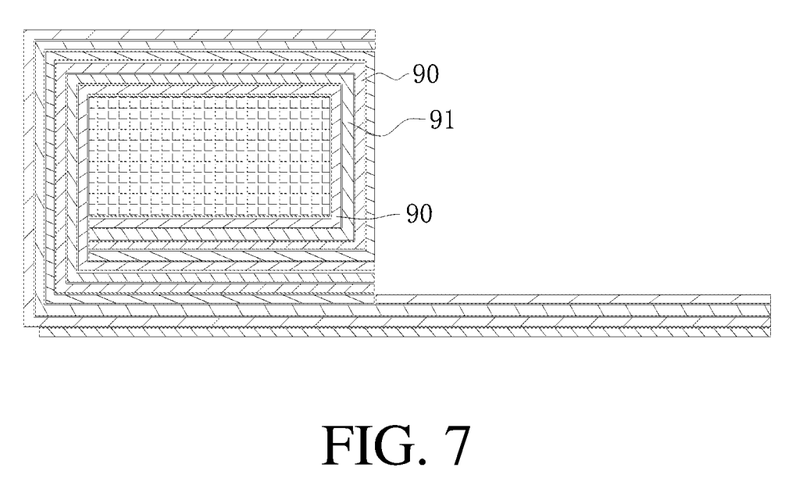
FIG. 7 is a schematic structural view of a double-sided PET tape according to an embodiment of the present application.

In FIG. 7: 90: PET backing, and 91: adhesive.

Figure 8:
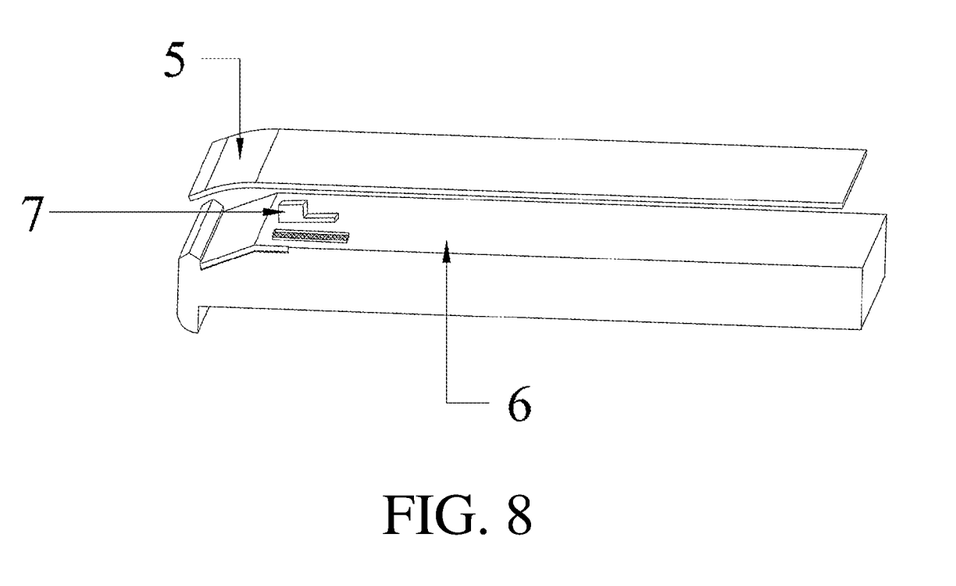
FIG. 8 is a schematic view of a connection relationship in an electronic device according to an embodiment of the present application.

In FIG. 8: 5: display screen, 6: metal middle frame, and 7: grounding elastic contact.

DETAILED DESCRIPTION

The preferred embodiment of the present application will be described in detail below with reference to the accompanying drawing. It is to be understood by those skilled in the art that the descriptions are only illustrative and exemplary, and should not be construed as a limitation to the protection scope of the present application.

It is to be noted that orientations such as top, bottom, upward, downward, leftward and rightward used herein are defined based on the directions in the drawings. They are relative concepts and thus can change according to different positions and different using states. These or other orientations should not be construed as limiting terms.

It is to be noted that the term "include" does not exclude other elements or steps, and the term "a" or "an" does not exclude a plural form.

In addition, it is further to be noted that, for any single technical feature described or implied in the embodiments of the present application, or any single technical feature illustrated or implied in the accompanying drawings, these technical features (or equivalents thereof) can still be combined to obtain other embodiments not directly mentioned in the present application.

It should be further understood that the terms such as "first", "second", and the like are used in the present application to describe various information, but the information should not be limited to these terms, and these terms are only used to distinguish the same type of information from each other. For example, without departing from the scope of the present application, "first" information may be referred to as "second" information, and similarly, "second" information may be referred to as "first" information.

It is to be noted that the same reference numeral refers to the same or approximately the same component in different drawings, Referring to FIGS. 1-3, according to a first aspect, an embodiment of the present application provides a grounding elastic contact, including an elastic core 10, a double-sided PET tape 20, a PI film 30, and a conductive layer 40.

Specifically, the double-sided PET tape 20, the PI film 30 and the conductive layer 40 are sequentially provided on an outer surface of the elastic core 10 from inside to outside. The PI film 30 is laminated and bonded on an outer side of the double-sided PET tape 20, namely the PI film 30 and the double-sided PET tape 20 are completely laminated. A middle region of the double-sided PET tape 20 is attached to an upper surface of the elastic core 10. As shown in FIG. 1 and FIG. 3, the upper surface of the elastic core 10 refers to a relatively upward surface of the elastic core 10. After passing through left and right sides of the elastic core 10 respectively, two ends of the double-sided PET tape 20 are laminated on a lower surface of the elastic core 10. The conductive layer 40 includes one end covering the upper surface of the elastic core 10, and the other end passing through the left side of the elastic core 10, attached to the lower surface of the elastic core 10 and protruding rightward relative to the elastic core 10 to form a welding part 41.

In addition, in the embodiment, the double-sided PET tape 20 includes a PET backing 90 and an adhesive 91 coated on two sides of the PET backing. A thickness of the double-sided PET tape 20 is b, and preferably a thickness of an ultra-thin PET double-sided tape is b≤0.015 mm.

Based on the above technical solutions, the overall grounding elastic contact is a P-type structure. A film layer laminated by the double-sided PET tape 20 and the PI film 30 is bent from the left and right sides to the lower surface of the elastic core 10 for an integrated and complete wrap around the elastic core 10, which can better protect the elastic core 10, prevent the damage such as layering to a right opening position of the elastic core 10 in use, and prolong the service life. Two film layers laminated by the double-sided PET tape 20 and the PI film 30 are attached to the lower surface of the elastic core 10, which can support the elastic core 10 well, keep the soft elastic core stable in the elastic compressing process, and particularly can better support a small-sized product. The small-sized product refers to a length of a product being 1-10 mm, and a width thereof being 1-5 mm. The double-sided PET tape 20 can support the conductive layer 40, such that the conductive layer 40 keeps flat without surface folding, thereby ensuring the desirable conductivity. With the PI film 30, the anti-fatigue performance of the conductive layer 40 can be improved, and even though the conductive layer 40 is compressed repeatedly, there is no fatigue fracture. It is experimentally demonstrated that when the conductive layer 40 is compressed 5,000 times repeatedly under a load of 300 g, no crack or fracture appears. The fatigue reliability meets the compress test of most mobile phones or the dynamic fatigue test of metal elastic gaskets. In addition, with the ultra-thin double-sided PET tape 20, namely the thickness of the double-sided PET tape 20 being b and b≤0.015 mm, a thickness loss of the elastic core 10 can be prevented to the greatest extent, and the stress of the elastic core 10 is released, which ensures the desirable resilience within the limited grounding space. Compared with existing solutions in which the elastic core 10 is wrapped by the conductive layer 40, because of no rigid deformation to the right side of the conductive layer (usually including the metal foil layer), the grounding elastic contact greatly reduces the thickness loss of the elastic core 10, effectively improves the resilience, and greatly improves the workspace and elastic stress of the product. In addition, the film layer laminated by the double-sided PET tape 20 and the PI film 30 is bent downward in the right opening region and attached to the lower surface of the elastic core 10, which is unlike the conventional solution in which the PI film is bent rightward and attached to the tail region of the conductive layer 40. The grounding elastic contact achieves the following beneficial effects: 1, as the region where the PI film 30 and the conductive layer 40 are attached is omitted, the tail size can be shortened. As a result, not only can the small-sized design be realized, the use of the valuable material be reduced, and the space be saved, but also the conductive path from the top down can be shortened, the electrical connection is conducted quickly, and there is no irradiation effect of the antenna to interfere other RF properties due to the long conductive path. 2, the PI film 30 is not bounded off under the long-time elastic force of the elastic core 10, or the workspace of the elastic core 10 is not squeezed for tight bonding to cause the thickness loss.

The grounding elastic contact having the above structure is specifically fabricated as follows:

A cutting table or a slitting machine is used to roughly cut the conductive layer, the PI film, the double-sided PET tape, and the elastic core into a required width.

A precision circular knife is used to precisely cut the above materials into a final width.

The conductive layer, the PI film, the double-sided PET tape, and the elastic core are attached sequentially from the bottom up.

The attached materials are wrapped by a wrapping machine according to a sequence in which the PI film is folded onto the elastic core, and the elastic core is folded.

The wrapped product is cut into a final required length by a precise cutter to obtain the final product.

As can be seen from the fabrication method, the double-sided PET tape 20 and the PI film 30 are laminated for a complete wrap around the elastic core 10, so the grounding elastic contact is an integrated product and is wrapped conveniently. With simple fabrication and lower production cost, the grounding elastic contact is controlled conveniently in machining precision, ensures the stability and consistency of the product, and can implement production of the small-sized product.

Preferably, a range of the thickness b of the double-sided PET tape is: 0.008 mm≤b≤0.012 mm, which not only keeps the conductive layer 40 flat without surface folding to ensure the reliability of conductivity, but also reduces the thickness loss of the elastic core 10 to the greatest extent to yield the desirable resilience.

In a preferred embodiment of the present application, a thickness of the PI film 30 is in a range of 7-25 μm, which can effectively improve the overall anti-fatigue performance of the product, and can reduce the thickness loss of the elastic core 10.

In some embodiments of the present application, the left side of the elastic core 10 is attached to the double-sided PET tape 20, and a gap is provided between the right side of the elastic core 10 and the double-sided PET tape 20. The gap provides a deformation space for the elastic core 10 to ensure the resilience of the product.

Specifically, the grounding elastic contact in the embodiment of the present application is particularly suitable for the small-sized product, and mainly applied to antenna grounding or RF grounding. For fear of radiation or coupling interference, an electrically conductive path should not get close to ⅛ (15 mm) of a 2.4 G signal wavelength that is most sensitive to the interference. In some embodiments of the present application, an overall length of the grounding elastic contact is L1 and a length of the welding part is L2, L1≤8 mm, L2≥2 mm, $$\frac{1}{3}L1 \le L2 \le \frac{1}{2}L1,$$

and L1≤8 mm, which ensures that the extended length of the conductive layer 40 is not overlong to get close to 15 mm. With L2≥2 mm, a welding region is provided to ensure the welding stability, thereby reducing the ground resistance. At the meantime, a further optimization is made to a length ratio of the elastic core 10 to the welding part 41, such that the small-sized grounding elastic contact can achieve the desirable welding stability and resilience, and thus ensures the conduction stability and low conductivity of the product, and prolongs the service life of the product.

In the present application, a length of the welding part 41 is preferably 2-3 mm. While ensuring the welding stability, this prevents the overlong conductive path of the product for the lengthened tail portion, and further reduces the resistance.

In some embodiments, a height of the grounding elastic contact is h and a width of which is w in a natural state, 0.5 mm≤h≤1.5 mm, w≥2 mm, and $$0.2 \leq \frac{h}{w} \leq 0.75 \text{mm},$$

which can ensure the desirable resilience of the grounding elastic contact, prevent the grounding elastic contact from deflecting or twisting in the repeated compressing process, and yields the high stability of the product in use.

In a specific embodiment, the conductive layer 40 is a copper foil provided with a gold-plated layer on an outer surface thereof. With the desirable electrical connection performance and the oxidation resistance, gold can exhibit good electrical performance when applied to the copper surface that is a good conductor per se. Exemplarily, a thickness of the gold-plated copper foil is in a range of 6-25 μm, and a thickness of the surface gold-plated layer is greater than 10 nm.

In addition, it is to be noted that the copper foil may also be replaced as an aluminum foil or an alloy metal foil having the same thickness. The gold-plated layer may also be replaced as a tin-plated layer (>1 μm) or a nickel-plated layer (>0.3 μm) or other anti-oxidative plated layers.

In addition, in the embodiment of the present application, the elastic core 10 includes PU foam or silicone foam. The elastic core 10 made of a foaming material can ensure the desirable fatigue resilience and the stable elastic force, and thus supports the full contact of the contact surface and prevents the failure in the resilience after excessively compressed by the metal. Exemplarily, a density of the elastic core is greater than or equal to 100 Kg/m³. In the embodiment, the elastic core 10 has a rate of resilience of greater than 80% when compressed by 50% for 72 h at 70° C.

When the welding part 41 is the conventional single-layer copper foil, there are a low bond strength, a poor peel strength and low quality of residual copper during welding due to the quite small thickness, which is disadvantageous to the stable electrical connection, and increases the ground resistance, particularly in vibratory cases. In view of the technical problem, in some embodiments of the present application, as shown in FIG. 3, a metal reinforcing plate 50 is bonded on an upper surface of the welding part 41 through a non-backing adhesive film. As shown in FIG. 1 and FIG. 3, the upper surface of the welding part 41 refers to a relatively upward surface of the welding part 41. When welded, the non-backing adhesive film can be broken down or vaporized, namely the tail portion of the conductive layer 40 is designed as a double-layer structure, which can improve the structural strength and weld strength of the tail portion, effectively prevent the fracture of the welding part 41, and facilitate the automatic assembly. When welded with a metal middle frame, the double-layer structure is fused completely, and thus the ground resistance is decreased.

Further, an anti-oxidative layer is provided on an upper surface of the metal reinforcing plate 50. The upper surface of the metal reinforcing plate 50 refers to a relatively upward surface of the metal reinforcing plate 50 in the figure. In this way, the metal reinforcing plate 50 exposed in the air cannot suffer the oxidation corrosion, thereby ensuring the long-term welding reliability.

Exemplarily, the metal reinforcing plate 50 is a copper foil provided with a PU layer on an upper surface thereof. The upper surface of the copper foil refers to a surface in a same direction as the upper surface of the metal reinforcing plate 50. The copper foil may employ electrolytic copper or rolled copper, namely the tail portion of the conductive layer 40 is designed as a double-layer copper foil provided with the PU layer on the upper surface thereof for corrosion resistance. The metal reinforcing plate 50 may further be designed as other metal film layers and usually a thickness thereof is greater than 10 μm. Likewise, the PU layer may be replaced as other corrosion-resistant plated layers such as a nickel-plated layer.

In some embodiments of the present application, in order to reinforce the welding and optimize the welding stability, a sum of a thickness of the conductive layer 40 and a thickness of the metal reinforcing plate 50 is preferably greater than or equal to 20 μm.

In some embodiments of the present application, an insulating non-backing double-sided tape 60 is provided on a lower surface of the conductive layer 40 which wraps the lower surface of the elastic core 10. The insulating non-backing double-sided tape can fix the component and insulate the bottom. When welded, the insulating non-backing double-sided tape 60 is broken down without affecting the welding stability and the connection stability. It does not need a special fixture in welding, can prevent the interference to the conduction path, and is only conducted by the welding position of the welding part 41. Exemplarily, a thickness of the insulating non-backing double-sided tape is not less than 10 μm. Preferably, a thickness of the insulating non-backing double-sided tape is in a range of 10-15 μm.

The grounding elastic contact provided by the present application is further described below in detail with specific embodiments. The embodiments described below are merely used as examples, rather than limitations to the present application.

Example 1

As shown in FIGS. 1-2, the grounding elastic contact includes an elastic core 10, a double-sided PET tape 20, a PI film 30, a conductive layer 40, and an insulating non-backing tape 60. The elastic core 10 includes PU foam. The conductive layer 40 is a copper foil plated with gold on an outer surface thereof. Overall, a length of the grounding elastic contact is 6 mm and a width of which is 2.5 mm. A length of the welding part is 2.6 mm. In a natural state, an overall height of the grounding elastic contact 10 is 0.76 mm, a thickness of the PI film 30 is 0.015 mm, a thickness of the double-sided PET tape 20 is 0.01 mm, a thickness of the conductive layer 40 is 0.03 mm, and a thickness of the insulating non-backing tape 60 is 0.01 mm.

Example 2

As shown in FIG. 3, the grounding elastic contact differs from that of Example 1 in: A metal reinforcing plate 50 is bonded on an upper surface of the welding part 41. The metal reinforcing plate 50 is a copper foil provided with a PU layer on an upper surface thereof. A thickness of the metal reinforcing plate 50 is 0.018 mm. Other features are the same as those in Example 1, and will not be repeated herein.

Comparative Example 1

As shown in FIG. 4, the grounding elastic contact includes an elastic core 1, PET sheets 2 on upper and lower sides of the elastic core, a PI film 3 wrapping around the elastic core and the PET sheets 2, and a conductive layer 4 around the PI film 3. A right end of PI film 3 wraps a right side of the elastic core 1. A left end of the PI film 3 is bent downward to a bottom surface of the elastic core 1, bonded on a lower surface of the bottom PET sheet 2, and lengthened rightward to bond with a right tail portion of the conductive layer 1. The right tail portion of the conductive layer 4 is formed into a welding part 41. The elastic core 1 includes PU foam. The conductive layer 4 is a copper foil plated with gold on an outer surface thereof.

The overall length of the grounding elastic contact is the same as that in Examples 1 and 2. In the natural state, the height of the grounding elastic contact is the same as that in Examples 1 and 2.

Comparative Example 2

As shown in FIG. 5, the grounding elastic contact includes an elastic core 1, PET sheets 2 on upper and lower sides of the elastic core 1, a PI film 3 wrapping around the elastic core and the PET sheets 2, and a conductive layer 4 around the PI film 3. A left end of the PI film 3 is bent to a bottom surface of the elastic core 1, and bonded with the bottom PET sheet 2. A right end of the PI film 3 wraps a right side of the elastic core 1, and is bent to an upper surface of a right tail portion of the conductive layer 4. As shown in FIG. 5, the upper surface of the right tail portion of the conductive layer 4 refers to a relatively upward surface of the conductive layer 4 in the figure. A left tail portion of the conductive layer 4 is formed into a welding part 41. The elastic core 1 includes PU foam. The conductive layer 4 is a copper foil plated with gold on an outer surface thereof.

The overall length of the grounding elastic contact is the same as that in Examples 1 and 2. In the natural state, the height of the grounding elastic contact is the same as that in Examples 1 and 2.

Comparative Example 3

As shown in FIG. 6, the grounding elastic contact includes an elastic core 1, PET sheets 2 on upper and lower surfaces of the elastic core 1, a PI film 3 wrapping around the elastic core 1 and the PET sheets 2, and a conductive layer 4 around the PI film 3. Two ends of the conductive layer 4 extend rightward and are bonded with each other to form a welding part 41. The elastic core 1 includes PU foam. The conductive layer 4 is a copper foil plated with gold on an outer surface thereof.

The overall length of the grounding elastic contact is the same as that in Examples 1 and 2. In the natural state, the height of the grounding elastic contact is the same as that in Examples 1 and 2.

It is to be noted that compared with Comparative Example 1, 2 and 3, the product in Examples 1 and 2 is controlled more easily in fabrication parameters, and has a smaller size. Specifically, a total length L1 of the smallest product fabricated in Examples 1 and 2 is 4.5 mm, while a total length of the smallest product fabricated in Comparative Example 1, 2 and 3 is greater than 6.5 mm.

In addition, the performance test is performed on the product in each of the examples and comparative examples:

The thickness loss and the elastic force are used to evaluate the resilience. The thickness loss is specifically tested by (designed thickness-actual thickness)/designed thickness*100%. The elastic force is specifically tested by vertically compressing the product to a specified working height with a pressure sensor and then reading a pressure parameter.

A conductive resistance after welding refers to a resistance from the head of the product to the metal middle frame after the product is welded with the metal middle frame.

A stability is tested by compressing the product 20,000 times to evaluate whether the elastic core is damaged.

A reliability of conductivity is tested by compressing the product 20,000 times with a key tester, and performing an environmental test (85° C./85% RH test, thermal shock test, and salt spray test), thereby evaluating whether the welded position is firm, and the resistance is stable without an increase.

The welding stability is tested by clamping the product, and observing a 90° C. peel strength and a residual copper rate.

The specific test results are shown in Table 1.

TABLE 1

| Performance test | Example 1 | Example 2 | Comparative Example 1 | Comparative Example 2 | Comparative Example 3 |
| --- | --- | --- | --- | --- | --- |
| Thickness loss/% | 5% | 5% | 50% | 10% | 50% |
| Elastic force/N (working height 0.32 mm) | 1.2N | 1.2N | 5N | 1.4N | 3.6N |
| Conductive resistance after welding/Ω | 0.008 Ω | 0.005 Ω | 0.010 Ω | 0.022 Ω | 0.006 Ω |
| Stability | High | High | Low | High | Low |
| Reliability of conductivity | Moderate | High | Low | Low | Moderate |
| Welding stability (peel strength/N) | 0.8N | 1.5N | 0.6N | 0.4N | 1.2N |

As can be seen from the test results, the product in Examples 1 and 2 has less thickness loss than that in Comparative Examples 1, 2 and 3. That is, to manufacture products having a same height, there is less usage of the elastic core in Examples 1 and 2 than Comparative Examples 1, 2 and 3, such that the thickness loss is reduced, and the production cost can be effectively reduced. Compared with Comparative Examples 1, 2 and 3, the product in Examples 1 and 2 has a lower elastic force after compressed to the working height, and can provide the stable low-stress elastic force. Compared with Comparative Examples 1, 2 and 3, the conductive resistance after welding of the product in Example 2 is lower, and the conductive resistance after welding of the product in Example 1 is increased relative to Comparative Example 3 but is greatly lower than that of the product in Comparative Examples 1 and 2. After compressed 20,000 times, the elastic core of the product in Examples 1 and 2 is not damaged, while that in Comparative Examples 1 and 3 is damaged obviously. After compressed 20,000 times and subjected to the environmental test, the elastic core of the product in Example 2 is still not damaged with the firm welded position, stable resistance and no increased resistance, the product in Example 1 falls out locally at the welded position, and the product in Comparative Examples 1, 2 and 3 shows the increased resistance and phenomena that products fall out to some extent. In the test on the welding stability, there are a larger peel strength and a higher residual copper rate in Example 2, followed by Comparative Example 3, and Example 1.

To sum up, there shows the better resilience, impedance performance, stability, reliability of conductivity and welding stability overall in Examples 1 and 2. Compared with Example 1, the reliability of conductivity and welding stability are greatly improved, and the impedance performance is better in Example 2.

According to a second aspect, an embodiment of the present application further provides an electronic device (not specifically shown in the figures), including a display screen, a metal middle frame, and the grounding elastic contact in the first aspect. The display screen is provided on the metal middle frame. The grounding elastic contact is provided between the display screen and the metal middle frame. The grounding elastic contact is ultrasonically welded with the metal middle frame through the metal reinforcing plate 50 and the welding part 41. A top of the grounding elastic contact abuts against the display screen. According to the electronic device in the embodiment, as the grounding elastic contact and the metal middle frame are ultrasonically welded, both the stability and the consistency can be ensured, and the reliability in electrical connection can be greatly improved.

In addition, with the grounding elastic contact in first aspect, the electronic device achieves all beneficial effects of the grounding elastic contact, which will not be repeated herein.

Further, in the embodiment of the present application, the display screen is preferably a flexible OLED screen or an LCD screen. With the popularization of the flexible OLED screen and the LCD screen in smart phones, the high-performance elastic grounding solution is of great importance.

In conclusion, in the grounding elastic contact and the electronic device provided by the present application, the overall grounding elastic contact is a P-type structure. A film layer laminated by the double-sided PET tape 20 and the PI film 30 is bent from the left and right sides to the lower surface of the elastic core 10 for an integrated and complete wrap around the elastic core 10. With the double-sided PET tape 20 and the PI film 30 for the complete wrap around the elastic core 10, flatness and fatigue resistance of the conductive layer 40 can be ensured, a damage to the elastic core 10 is prevented, service life of the product is longer, production cost is lower, a process is controlled more easily, product consistency is ensured and a small-sized product can be fabricated. In addition, with the ultra-thin double-sided PET tape 20, a thickness loss of the elastic core 10 can be prevented to the greatest extent, and stable low-stress resilience is kept within the limited grounding space. Furthermore, the double-sided PET tape 20 and the PI film 30 at the right side are bent to the lower surface of the elastic core 10, which can prevent an extension of the tail welding part, reduce a usage of the elastic core 10, and ensure resilience and welding stability.

The specification discloses the present application with the accompanying drawings, and also enable those skilled in the art to practice the present application, including making and using any devices or systems, using appropriate materials and performing any incorporated methods. The scope of the present application is defined by the claims, and includes other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A grounding elastic contact, comprising an elastic core, a double-sided polyethylene terephthalate (PET) tape, a polyimide (PI) film, and a conductive layer, wherein
the double-sided PET tape, the PI film, and the conductive layer are sequentially provided on an outer surface of the elastic core from inside to outside; the PI film is laminated and bonded on an outer side of the double-sided PET tape; a middle region of the double-sided PET tape is attached to an upper surface of the elastic core; after passing through left and right sides of the elastic core respectively, two ends of the double-sided PET tape are laminated on a lower surface of the elastic core; and the conductive layer comprises one end bonded on the upper surface of the elastic core, and the other end passing through the left side of the elastic core, attached to the lower surface of the elastic core and protruding rightward relative to the elastic core to form a welding part;
wherein the double-sided PET tape comprises a PET backing and an adhesive coated on two sides of the PET backing; and a thickness of the double-sided PET tape is b, wherein b≤0.015 mm.

2. The grounding elastic contact according to claim 1, wherein the left side of the elastic core is attached to the double-sided PET tape; a gap is provided between the right side of the elastic core and the double-sided PET tape; and an insulating non-backing double-sided tape is provided on a lower surface of the conductive layer which wraps the lower surface of the elastic core.

3. The grounding elastic contact according to claim 2, wherein the grounding elastic contact further comprises a metal reinforcing plate provided on an upper surface of the welding part.

4. The grounding elastic contact according to claim 3, wherein the metal reinforcing plate is a copper foil provided with an anti-oxidative layer on an upper surface thereof, and the anti-oxidative layer is a PU layer or a nickel-plated layer.

5. An electronic device, comprising a display screen, a metal middle frame, and the grounding elastic contact according to claim 3, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

6. An electronic device, comprising a display screen, a metal middle frame, and the grounding elastic contact according to claim 4, wherein the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

7. The grounding elastic contact according to claim 1, wherein an overall length of the grounding elastic contact is L1, and a length of the welding part is L2, L1≤8 mm, L2≥2 mm, and $$\frac{1}{3}L1 \le L2 \le \frac{1}{2}L1.$$

8. The grounding elastic contact according to claim 7, wherein the grounding elastic contact further comprises a metal reinforcing plate provided on an upper surface of the welding part.

9. The grounding elastic contact according to claim 8, wherein the metal reinforcing plate is a copper foil provided with an anti-oxidative layer on an upper surface thereof, and the anti-oxidative layer is a PU layer or a nickel-plated layer.

10. An electronic device, comprising a display screen, a metal middle frame, and the grounding elastic contact according to claim 9, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

11. An electronic device, comprising a display screen, a metal middle frame, and the grounding elastic contact according to claim 8, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

12. The grounding elastic contact according to claim 1, wherein the elastic core comprises polyurethane (PU) foam or silicone foam.

13. The grounding elastic contact according to claim 12, wherein the grounding elastic contact further comprises a metal reinforcing plate provided on an upper surface of the welding part.

14. The grounding elastic contact according to claim 13, wherein the metal reinforcing plate is a copper foil provided with an anti-oxidative layer on an upper surface thereof, and the anti-oxidative layer is a PU layer or a nickel-plated layer.

15. An electronic device, comprising a display screen, a metal middle frame, and the grounding elastic contact according to claim 14, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

16. An electronic device, comprising a display screen, a metal middle frame, and the grounding elastic contact according to claim 13, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

17. The grounding elastic contact according to claim 1, wherein the grounding elastic contact further comprises a metal reinforcing plate provided on an upper surface of the welding part.

18. The grounding elastic contact according to claim 17, wherein the metal reinforcing plate is a copper foil provided with an anti-oxidative layer on an upper surface thereof, and the anti-oxidative layer is a PU layer or a nickel-plated layer.

19. An electronic device, comprising a display screen, a metal middle frame, and the grounding elastic contact according to claim 18, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

20. An electronic device, comprising a display screen, a metal middle frame, and the grounding elastic contact according to claim 17, wherein
the display screen is provided on the metal middle frame; the grounding elastic contact is provided between the display screen and the metal middle frame; the grounding elastic contact is ultrasonically welded with the metal middle frame through the metal reinforcing plate and the welding part, and a top of the grounding elastic contact abuts against the display screen.

\* \* \* \* \*